United States Patent
O'Neil (10) Patent No.: US 11,874,139 B2
(45) Date of Patent: Jan. 16, 2024

(54) RATIOMETRIC POSITION MEASUREMENT

(71) Applicant: Hamilton Sundstrand Corporation, Charlotte, NC (US)

(72) Inventor: John O'Neil, Litchfield, CT (US)

(73) Assignee: HAMILTON SUNDSTRAND CORPORATION, Charlotte, NC (US)

(*) Notice: Subject to any disclaimer, the term of this patent is extended or adjusted under 35 U.S.C. 154(b) by 16 days.

(21) Appl. No.: 17/543,824

(22) Filed: Dec. 7, 2021

(65) Prior Publication Data
US 2023/0175867 A1    Jun. 8, 2023

(51) Int. Cl.
*G01D 5/14*     (2006.01)
*G01D 5/22*     (2006.01)
*H03M 1/12*     (2006.01)
*H04L 67/12*    (2022.01)

(52) U.S. Cl.
CPC ............. *G01D 5/14* (2013.01); *G01D 5/2291* (2013.01); *H03M 1/12* (2013.01); *H04L 67/12* (2013.01)

(58) Field of Classification Search
CPC ...... G01D 5/14; G01D 5/2046; G01D 5/2073; G01D 5/2291; G01D 5/2448; G01D 5/35383
See application file for complete search history.

(56) References Cited

U.S. PATENT DOCUMENTS

| | | | | |
|---|---|---|---|---|
| 4,656,585 A | * | 4/1987 | Stephenson | G01D 9/005 701/14 |
| 6,331,759 B1 | * | 12/2001 | Atmur | G01D 5/2073 318/605 |
| 9,217,662 B2 | * | 12/2015 | Saloio, Jr. | G01H 1/006 |
| 9,391,630 B2 | | 6/2016 | Saloio et al. | |
| 10,564,013 B2 | | 2/2020 | Zhitomirsky | |
| 10,739,167 B2 | | 8/2020 | Bocage et al. | |
| 2004/0001015 A1 | | 1/2004 | Games | |

(Continued)

FOREIGN PATENT DOCUMENTS

| | | |
|---|---|---|
| EP | 1884746 A2 | 2/2008 |
| EP | 2955488 A1 | 12/2015 |
| WO | 2021223627 A1 | 11/2021 |

OTHER PUBLICATIONS

European Search Report for Application No. 22208581.3, dated Mar. 31, 2023, 7 pages.

*Primary Examiner* — Steven L Yeninas
(74) *Attorney, Agent, or Firm* — CANTOR COLBURN LLP (57) ABSTRACT

Systems and methods for sensor position measurements are provided. Aspects include receiving, through a first signal path, a first secondary signal from a first sensor and a built in test (BIT) signal, wherein the first signal path comprises a first multiplexer connected to a first filter, receiving, through a second signal path, a second secondary signal from the first sensor and the BIT signal, wherein the second signal path comprises a second multiplexer connected to a second filter, wherein the first signal path and the second signal path are connected to a third multiplexer, wherein the third multiplexer is connected to a first analog to digital converter (ADC), receiving, by a controller, an output signal from an output of the first ADC, and determining, by the controller, a position measurement for the first sensor based on the first secondary signal, the second secondary signal, and the BIT signal.

20 Claims, 7 Drawing Sheets

(56) References Cited

U.S. PATENT DOCUMENTS

| | | | |
|---|---|---|---|
| 2008/0030391 A1* | 2/2008 | Games | G01D 3/032 341/155 |
| 2015/0365099 A1* | 12/2015 | Saloio | G01D 5/2291 341/141 |
| 2019/0025052 A1* | 1/2019 | Nee | G01D 5/00 |
| 2020/0264014 A1* | 8/2020 | Beckman | G01D 5/2208 |

* cited by examiner

RATIOMETRIC POSITION MEASUREMENT

BACKGROUND

The present invention generally relates to sensor position measurements, and more specifically, to an improved topology for alternating current (AC) ratiometric position measurements Resolvers and linear variable differential transformers (LVDTs) are used in a variety of applications to provide position feedback. For example, resolvers are oftentimes associated with actuators to provide feedback regarding the state of the actuator (e.g., open, partially open, closed) LVDTs and resolvers each generate a pair of alternating current (AC) sensor signals that together indicate position and/or angle.

Typically, a resolver and/or LVDT monitors the excitation signal and the corresponding output signals simultaneously to determine position. However, in some applications, a multiplexer is used to sample the respective signals successively as opposed to simultaneously. Monitoring the sampled signals successively requires additional circuitry referred to as a signal conditioning circuit. Design of these signal conditioning circuits must weigh the cost of the individual components against the sampling speed for each signal while serving multiple sensors aboard an aircraft.

BRIEF DESCRIPTION

Embodiments of the present invention are directed to a system. A non-limiting example of the system includes a signal conditioning circuit including a first signal path comprising a first multiplexer connected to a first filter, wherein the first signal path receives a first secondary signal from a first sensor and a built in test (BIT) signal, a second signal path comprising a second multiplexer connected to a second filter, wherein the second signal path receives a second secondary signal from the first sensor and the BIT signal, wherein the first signal path and the second signal path are connected to a third multiplexer, and a first analog to digital converter (ADC) connected to an output of the third multiplexer, and a controller connected to an output of the first ADC, wherein the controller is configured to determine a position measurement for the first sensor based on the first secondary signal, the second secondary signal, and the BIT signal.

In addition to one or more of the features described above, or as an alternative, further embodiments of the system may include that the signal conditioning circuit further includes a third signal path comprising a fourth multiplexer connected to a third filter, wherein the third signal path receives a third secondary signal from a second sensor and the BIT signal, a fourth signal path comprising a fifth multiplexer connected to a fourth filter, wherein the fourth signal path receives a fourth secondary signal from the second sensor and the BIT signal, wherein the third signal path and the fourth signal path are connected to a sixth multiplexer, a second ADC connected to an output of the sixth multiplexer, wherein the controller is connected to an output of the second ADC and wherein the controller is further configured to determine a position measurement of the second sensor based on the third secondary signal, the fourth secondary signal, and the BIT signal.

In addition to one or more of the features described above, or as an alternative, further embodiments of the system may include that determining the position measurement for the first sensor based on the first secondary signal, the second secondary signal, and the built in test signal comprises calculating the position, whereby Position=(E1/BIT1_E1−E2/BIT1_E2)/(E1/BIT1_E1+E2/BIT1_E2), wherein E1 comprises the first secondary signal, wherein E2 comprises the second secondary signal, wherein BIT1_E1 comprises the built in test signal traversing the first signal path, and wherein BIT1_E2 comprises the built in test signal traversing the second signal path.

In addition to one or more of the features described above, or as an alternative, further embodiments of the system may include that the first signal path further receives an excitation signal into an input of the first multiplexer.

In addition to one or more of the features described above, or as an alternative, further embodiments of the system may include that the BIT signal comprises a square wave having a first frequency.

In addition to one or more of the features described above, or as an alternative, further embodiments of the system may include that excitation signal comprises a second frequency; and wherein the first frequency is equivalent to the first frequency.

In addition to one or more of the features described above, or as an alternative, further embodiments of the system may include that the first sensor comprises a linear variable differential transformer.

In addition to one or more of the features described above, or as an alternative, further embodiments of the system may include that the first sensor comprises a resolver.

In addition to one or more of the features described above, or as an alternative, further embodiments of the system may include that the first filter comprises a 2-pole filter.

In addition to one or more of the features described above, or as an alternative, further embodiments of the system may include that the controller comprises a field programmable gate array (FPGA).

Embodiments of the present invention are directed to a method. A non-limiting example of the method includes receiving, through a first signal path, a first secondary signal from a first sensor and a built in test (BIT) signal, wherein the first signal path comprises a first multiplexer connected to a first filter, receiving, through a second signal path, a second secondary signal from the first sensor and the BIT signal, wherein the second signal path comprises a second multiplexer connected to a second filter, wherein the first signal path and the second signal path are connected to a third multiplexer, wherein the third multiplexer is connected to a first analog to digital converter (ADC), receiving, by a controller, an output signal from an output of the first ADC, and determining, by the controller, a position measurement for the first sensor based on the first secondary signal, the second secondary signal, and the BIT signal.

In addition to one or more of the features described above, or as an alternative, further embodiments of the method may include receiving, through a third signal path, a third secondary signal from a second sensor and the BIT signal, wherein the third signal path comprises a fourth multiplexer connected to a third filter, receiving, through a fourth signal path, a fourth secondary signal from the second sensor and the BIT signal, wherein the fourth signal path comprises a fifth multiplexer connected to a third filter, wherein the third signal path and the fourth signal path are connected to a sixth multiplexer, wherein the sixth multiplexer is connected to a second analog to digital converter (ADC), receiving, by the controller, an output signal from an output of the second ADC, and determining, by the controller, a position measurement for the second sensor based on the third secondary signal, the fourth secondary signal, and the BIT signal.

In addition to one or more of the features described above, or as an alternative, further embodiments of the method may include that determining the position measurement for the first sensor based on the first secondary signal, the second secondary signal, and the built in test signal comprises calculating the position, whereby Position=(E1/BIT1_E1−E2/BIT1_E2)/(E1/BIT1_E1+E2/BIT1_E2), wherein E1 comprises the first secondary signal, wherein E2 comprises the second secondary signal, wherein BIT1_E1 comprises the built in test signal traversing the first signal path, and wherein BIT1_E2 comprises the built in test signal traversing the second signal path.

In addition to one or more of the features described above, or as an alternative, further embodiments of the method may include that the first signal path further receives an excitation signal into an input of the first multiplexer.

In addition to one or more of the features described above, or as an alternative, further embodiments of the method may include that the BIT signal comprises a square wave having a first frequency.

In addition to one or more of the features described above, or as an alternative, further embodiments of the method may include that excitation signal comprises a second frequency; and wherein the first frequency is equivalent to the first frequency.

In addition to one or more of the features described above, or as an alternative, further embodiments of the method may include that the first sensor comprises a linear variable differential transformer.

In addition to one or more of the features described above, or as an alternative, further embodiments of the method may include that the first sensor comprises a resolver.

In addition to one or more of the features described above, or as an alternative, further embodiments of the method may include that the first filter comprises a 2-pole filter.

In addition to one or more of the features described above, or as an alternative, further embodiments of the method may include that the controller comprises a field programmable gate array (FPGA).

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not require but does include a direct connection between the elements with no intervening elements/connections between them. All of these variations are considered a part of the specification.

DETAILED DESCRIPTION

For the sake of brevity, conventional techniques related to making and using aspects of the invention may or may not be described in detail herein. In particular, various aspects of aircraft electric power systems to implement the various technical features described herein are well known. Accordingly, many conventional implementation details are only mentioned briefly herein or are omitted entirely without providing the well-known system and/or process details.

Figure 1:
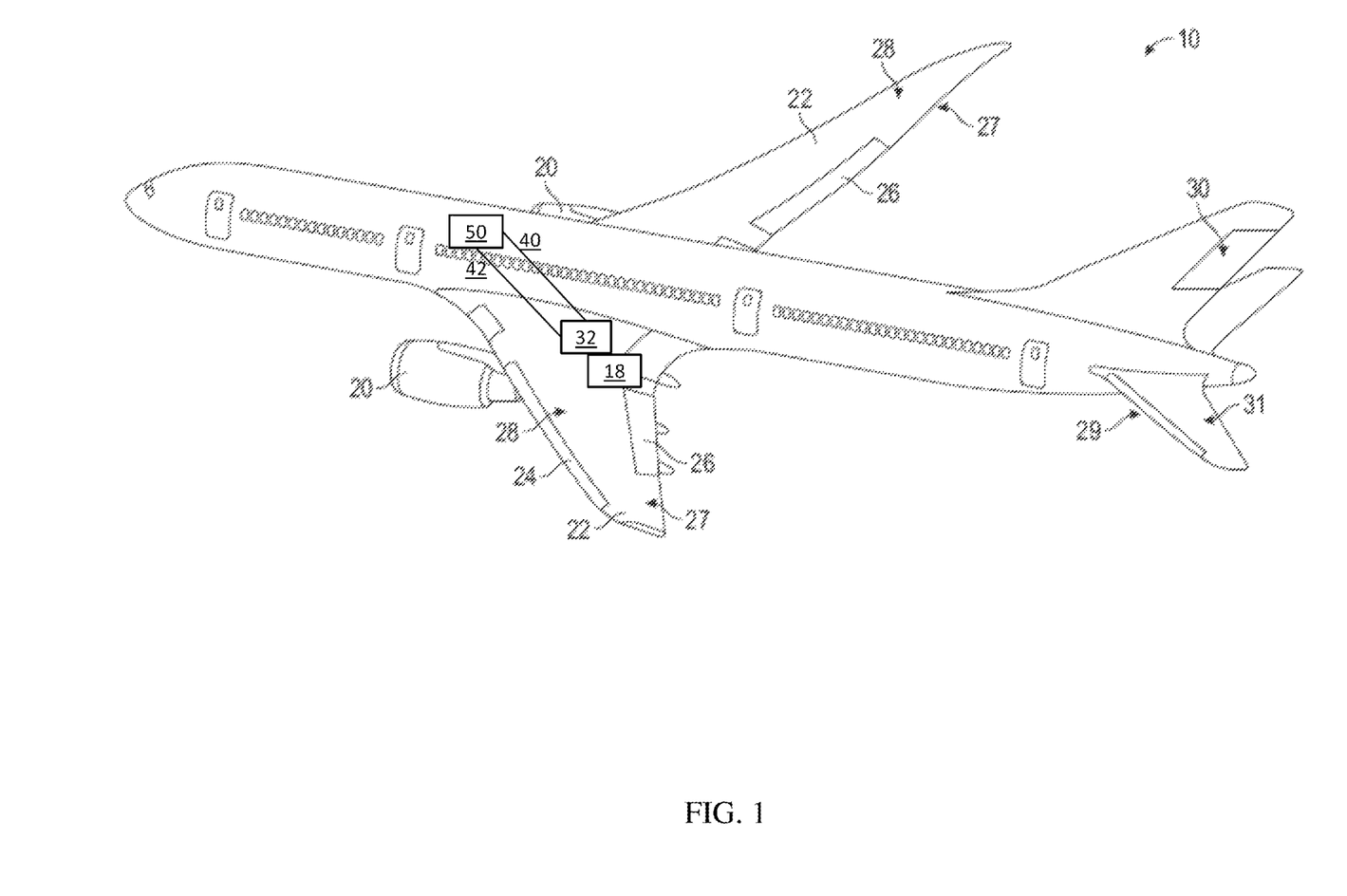
FIG. 1 is a perspective view of an aircraft that may incorporate embodiments of the present disclosure.

FIG. 1 illustrates an example of a commercial aircraft 10 having aircraft engines 20 that may embody aspects of the teachings of this disclosure. The aircraft 10 includes two wings 22 that each include one or more slats 24 and one or more flaps 26. The aircraft further includes ailerons 27, spoilers 28, horizontal stabilizer trim tabs 29, rudder 30 and horizontal stabilizer 31. The term "control surface" used herein includes but is not limited to either a slat or a flap or any of the above described. It will be understood that the slats 24 and/or the flaps 26 can include one or more slat/flap panels that move together. The example aircraft 10 includes an actuator 18. Connected to the actuator 18 is a transformer based sensor 32. In some examples, the sensor 32 is a linear variable differential transformer, a rotary variable differential transformer, or a resolver. The transformer based sensor 32 is connected to a processing system 50, such as an aircraft controller, via two sensor cables 40, 42. The processing system 50 determines the position of the actuator based on the relative amplitudes of the two sensor cables 40, 42, and utilizes the determined information to control the actuator 18.

Figure 2:
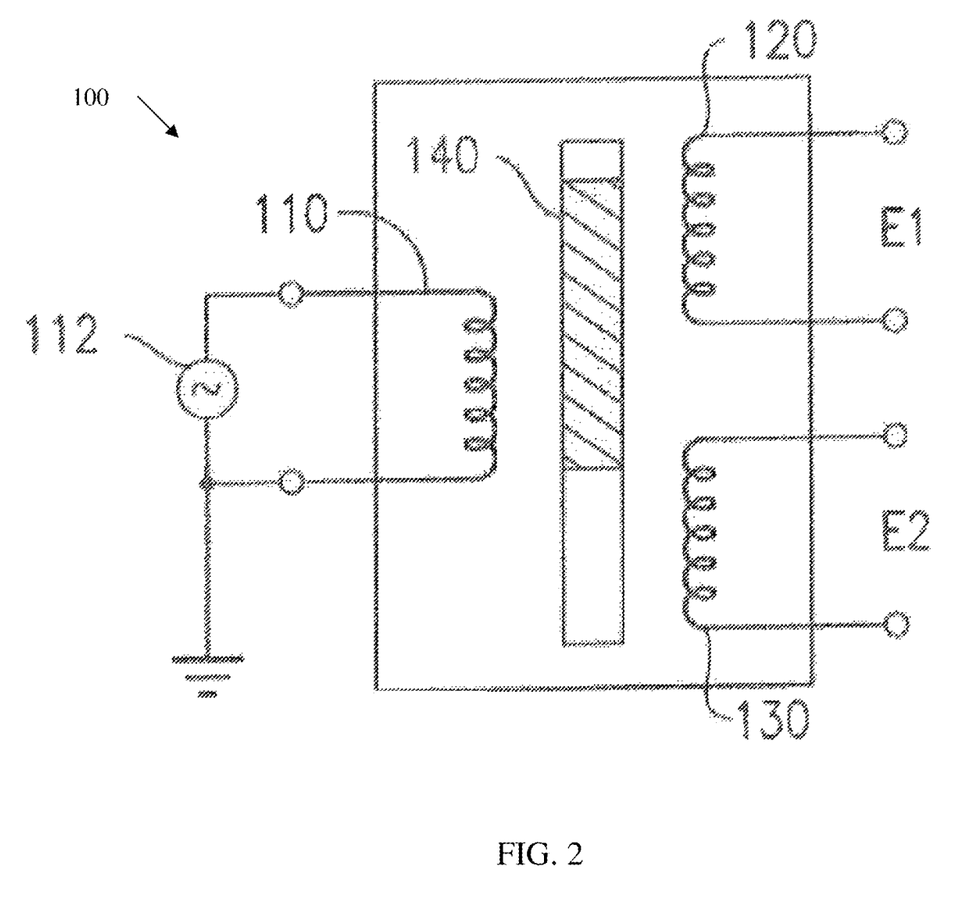
FIG. 2 depicts an example linear variable differential transformer.

FIG. 2 depicts an example linear variable differential transformer. The example linear variable differential transformer sensor 100 that can be used as the transformer based sensor 32 of FIG. 1. The linear variable differential transformer sensor 100 includes an input winding 110 connected to an AC excitation voltage source 112. Across from the input winding 110 are two output windings 120, 130 each having a corresponding output E1, E2 (sometimes referred to as "secondary outputs"). Between the output windings 120, 130 is a sliding magnetic core 140. The sliding magnetic core 140 is connected to an actuator and slides as the actuator moves. The shifting of the magnetic core alters the number of turns connecting each output winding 120, 130 to the input winding 110, and affects a corresponding change in the current signal output on each of the outputs E1, E2. In an alternate configuration, the core 140 remains stationary and the input winding 110 or the two output windings 120, 130 shift along with the actuator.

Figure 3:
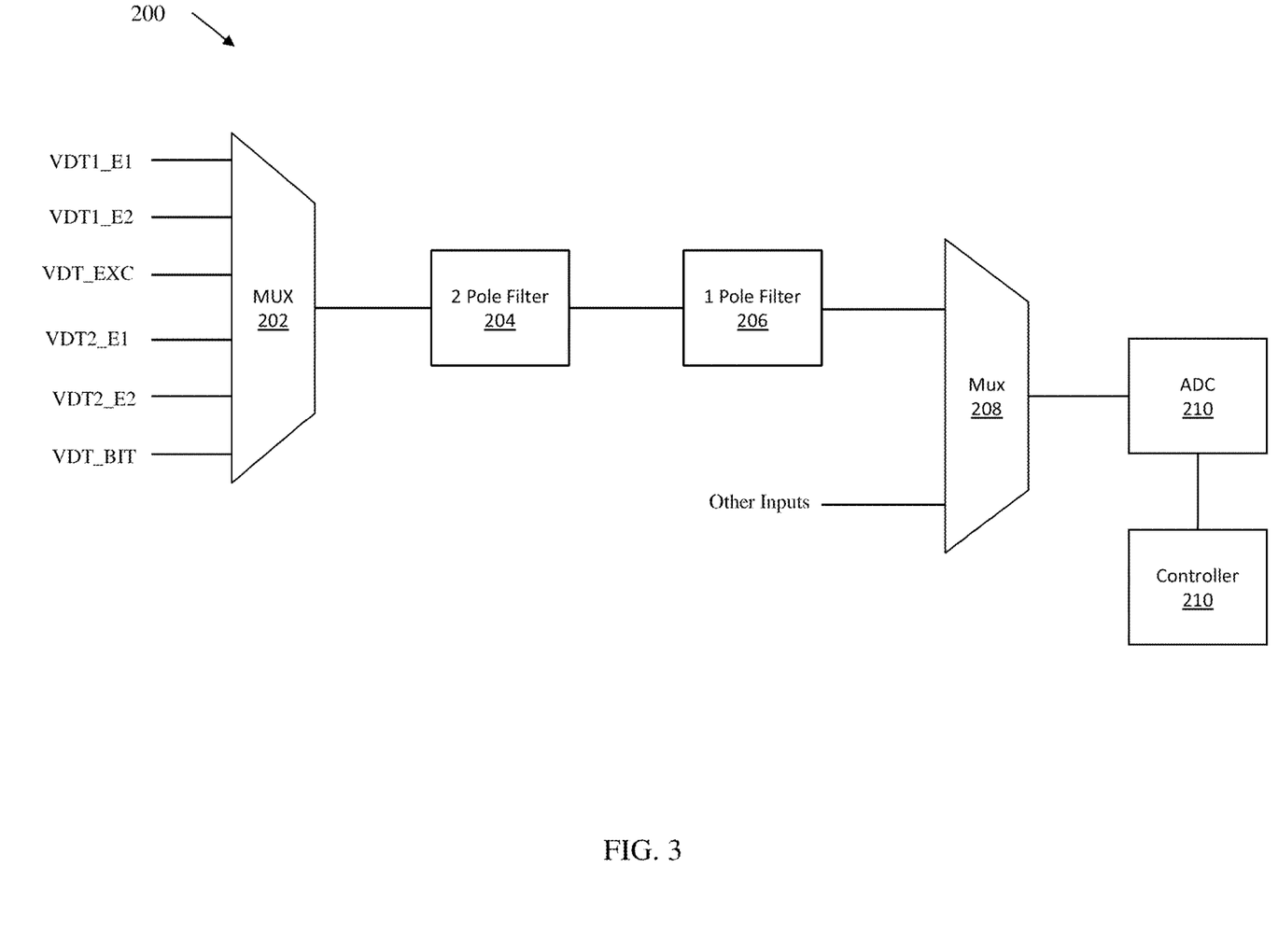
FIG. 3 depicts a block diagram of an example signal conditioning circuit.

FIG. 3 depicts a block diagram of an example signal conditioning circuit. The circuit 200 is configured to receive a plurality of alternating current (AC) input signals (VDT1_E1, VDT1_E2, VDT2_E1, VDT2_E2, other inputs) from a plurality of sensors. Example sensors include LVDTs, RVDTs, resolvers, and/or other sensors. The circuit 200 includes a first stage multiplexer (MUX) 202 which receives a total of six (6) AC input signals. As illustrated, The AC input signals include two secondary signals from a first sensor VDT1 (VDT1_E1, VDT1_E2), two secondary signals from a second sensor VDT2 (VDT2_E1, VDT2_E2), the shared excitation signal (VDT_EXC), and a built in test (BIT) signal (VDT_BIT). These signals are fed through the same signal path through the first stage multiplexer 202 and through shared antialiasing filters 204, 206 into a second stage MUX 208. This circuit 200 utilizes the same signal path so that any gain and/or frequency response variations caused by the first tier MUX 202 and filters 204, 206 would occur identically on the signals, and therefor the effects would cancel. This shared signal path will also cause a timing skew due to the non-synchronism of the measurements. However, the time interval is sufficiently short so that the error potentially introduced is small enough to be ignored. The second tier MUX 208 selects its inputs form the outputs of the first tier MUX 202. The output of the second tier MUX 208 is fed into an analog to digital converter (ADC) to digitize. The output of the ADC 210 can be provided to controller 212 which could be a gate array, general purpose processor, and the like. The controller 212 determines a position measurement from the plurality of sensors. The position of an LVDT (the position of the core 140—and thus the actuator) is given by the secondary windings using equation [1] below. For a resolver, the core position is given by the secondary windings using equation [2] below where the secondary windings are orthogonal. In both cases, the position is related to the ratio of the two secondary windings signals (E1, E2).

$$\text{LVDT Position}=(E1-E2)/(E1+E2) \qquad [1]$$

$$\text{Resolver Position}=\arctan(E1/E2) \qquad [2]$$

Figure 4:
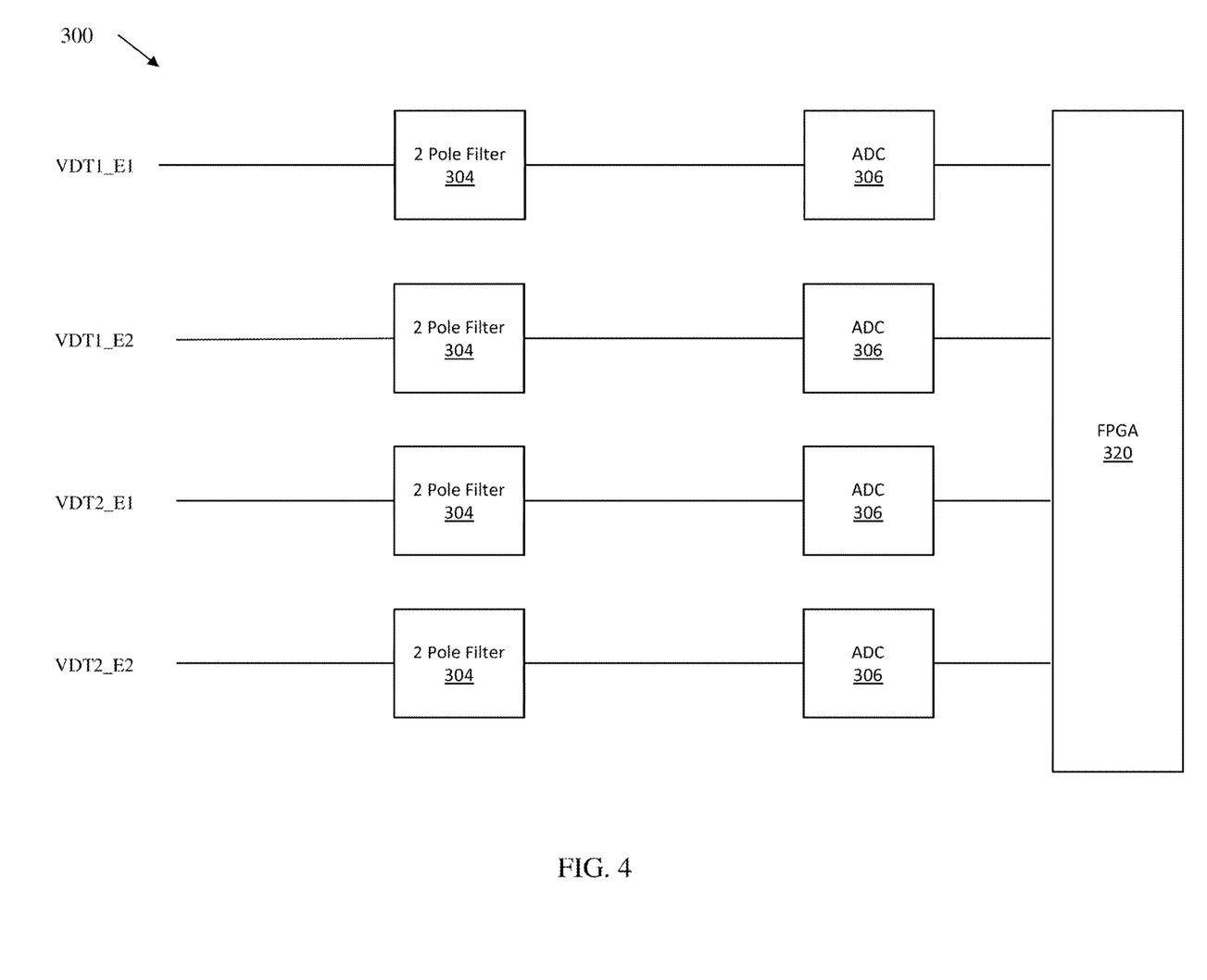
FIG. 4 depicts a block diagram of an exemplary non-interleaved signal conditioning.

FIG. 4 depicts a block diagram of an exemplary non-interleaved signal conditioning. In this circuit 300, the secondary winding signals (VDT1_E1, VDT1_E2, VDT2_E1, VDT2_E2) have their own signal paths through separate filters 304 before being fed into the input of an ADC 306 and outputted to an FPGA 320 (controller). While this topology provides faster acquisition of the secondary winding signals, since the E1 and E2 signals use different filtering 304 and ADC 306 paths, any filter and/or ADC gain errors are not cancelled out here. Further, this topology requires multiple filters and multiple ADCs for proper operation. ADCs, in generally, have a higher monetary cost than multiplexers.

Figure 5:
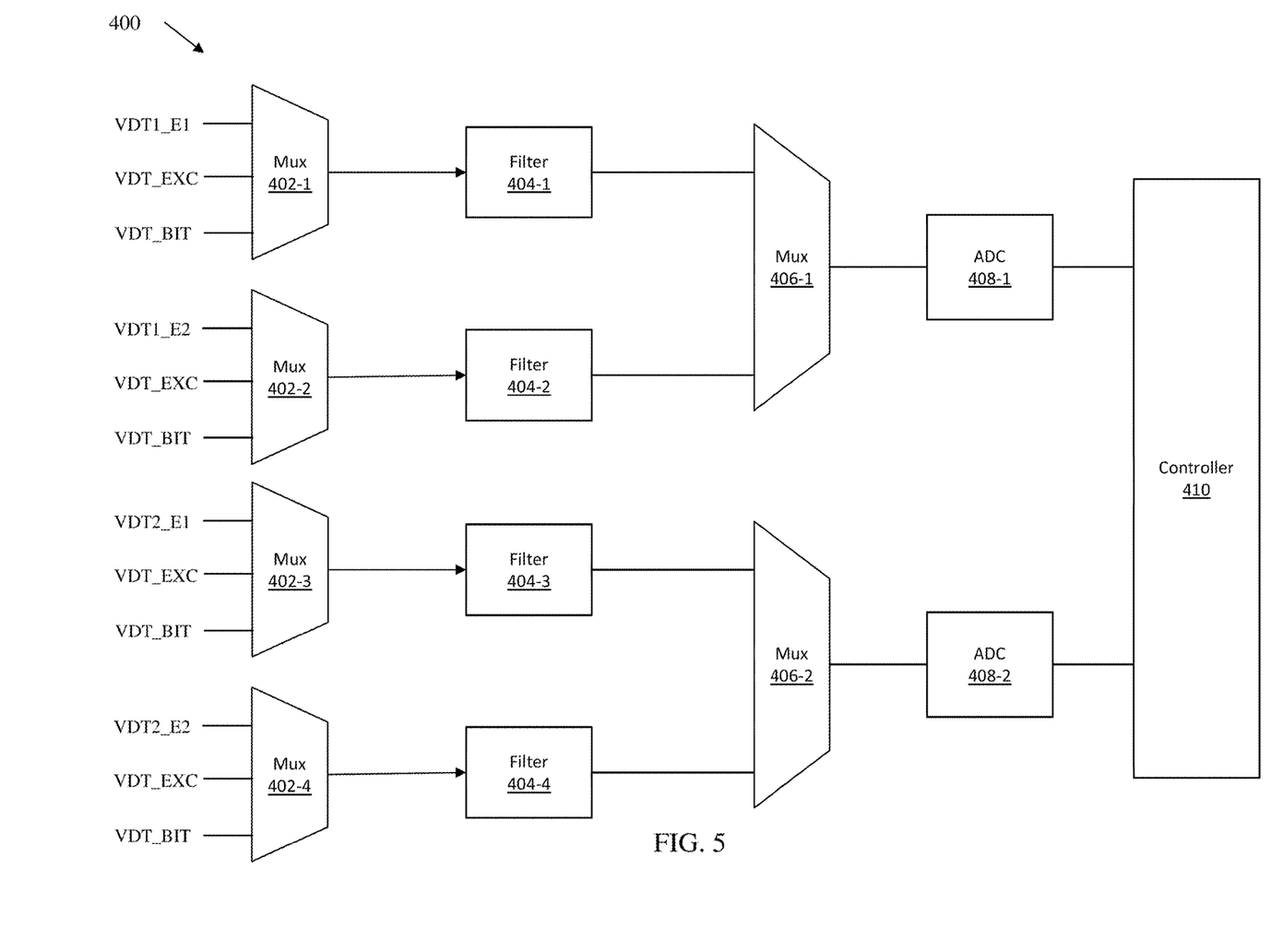
FIG. 5 depicts a block diagram of an improved signal conditioning circuit according to one or more embodiments.

FIG. 5 depicts a block diagram of an improved signal conditioning circuit according to one or more embodiments. In one or more embodiments, the circuit 400 includes a plurality of signal paths for receiving an AC input signal from a sensor such as, for example, an LVDT, RVDT, and/or resolver. Each signal path includes a first stage MUX 402-1, 402-2, 402-3, 402-4 and a filter 404-1, 404-2, 404-3, 404-4. The signal paths each receive as inputs a secondary winding signal from a sensor (E1 or E2), the sensor excitation signal (VDT_EXC), and a built in test (BIT) signal (VDT_BIT). The BIT signal is utilized to verify the proper performance of the antialiasing filters 404-1, 404-2, 404-3, 404-4. In one or more embodiments, the BIT signal is a square wave at the excitation frequency. The circuit 400 also includes two second stage MUXs 406-1, 406-2 that each receive two signal path inputs. The two signal path inputs correspond to first secondary windings E1 and second secondary windings E2 of the same VDT sensor. Also note, the excitation signal and the BIT signal are shared by the two sensors (VDT1, VDT2) and are inputs to all four first stage MUXs 402. The second stage MUXs 406 output to corresponding ADCs 408-1, 408-2 which digitize the signal and feed to the controller 410. In one or more embodiments, the controller 410 can be a field programmable gate array (FPGA), a general purpose processor, and/or the like.

In one or more embodiments, the BIT input (VDT_BIT) is a square wave with an equivalent frequency of the excitation signal (VDT_EXC) and is processed with synchronous demodulation at the fundamental and third harmonic for all signal paths. As such, the calculation of the position of the sensor is based on the secondary windings signals (E1, E2) and the BIT signal and is illustrated below in equation [3].

$$\text{Position}=(E1/\text{BIT}_{1\_E1}-E2/\text{BIT}_{1\_E2})/(E1/\text{BIT}_{1\_E1}+E2/\text{BIT}_{1\_E2}) \qquad [3]$$

$\text{BIT}_{1\_E1}$ is the BIT signal selected along the E1 signal path, and processed at the fundamental frequency. This cancels any gain errors of the E1 signal path. $\text{BIT}_{1\_E2}$ is the BIT signal selected along the E2 signal path, and processed at the fundamental frequency. This also cancels any gain errors of the E2 signal path. E1 refers to the first secondary winding of a sensor (e.g., LVDT) and E2 refers to the second secondary winding of the same sensor.

$$\text{Resolver Compensated Position}=\text{ArcTAN}(E1/\text{BIT}_{1\_E1}/E2/\text{BIT}_{1\_E2}) \qquad [4]$$

Equations [3] and [4] can be referred to as a compensated position measurement equations. The BIT signal is used for compensation because it is entirely internal to the electronics whereas the excitation is generated by the electronics but is exposed to external influences at the sensor along the way. The BIT and excitation signals are steady-state and may be acquired at a lower-rate allowing the multiplexers to be wider allowing for additional signal inputs, in one or more embodiments. Further, in one or more embodiments, using a continual demodulation signal allows measurement of phase delay from the Excitation output to the Secondary signal inputs, which may be used for resolver quadrant information, and/or coil health.

While the illustrated examples shown in the figures has two sensors with three inputs to the first stage multiplexers, any number of sensor secondary signals can be obtained using wider multiplexers, for example. In some applications, the sensors for a controller are acquired at the highest rate. Further, in some embodiments, the multiplexers are selected independently based on the rate of acquisition for the application. For example, one multiplexer may be skewed by one half of an acquisition cycle which would thus provide inputs to the controller at twice the rate of another multiplexer in a different signal path.

In one or more embodiments, the improved signal conditioning circuit reduces the number of ADCs required for processing sensor inputs. ADCs have a higher monetary cost than multiplexers. When designing signal conditioning circuits, the monetary costs are taken into consideration with respect to the performance requirements. In one or more embodiments, the second stage MUXs 406-1, 406-2 can be further reduced to a single second stage MUX with a single ADC outputting to the controller 410. In this sense, the second stage MUX would be a four (4) input MUX and the total ADCs would reduce from 2 to 1. In addition, a second filter would be needed along the signal paths for a total of four extract filters. While this further decreases the total cost, the per signal sampling rate is also reduced.

Figure 6:
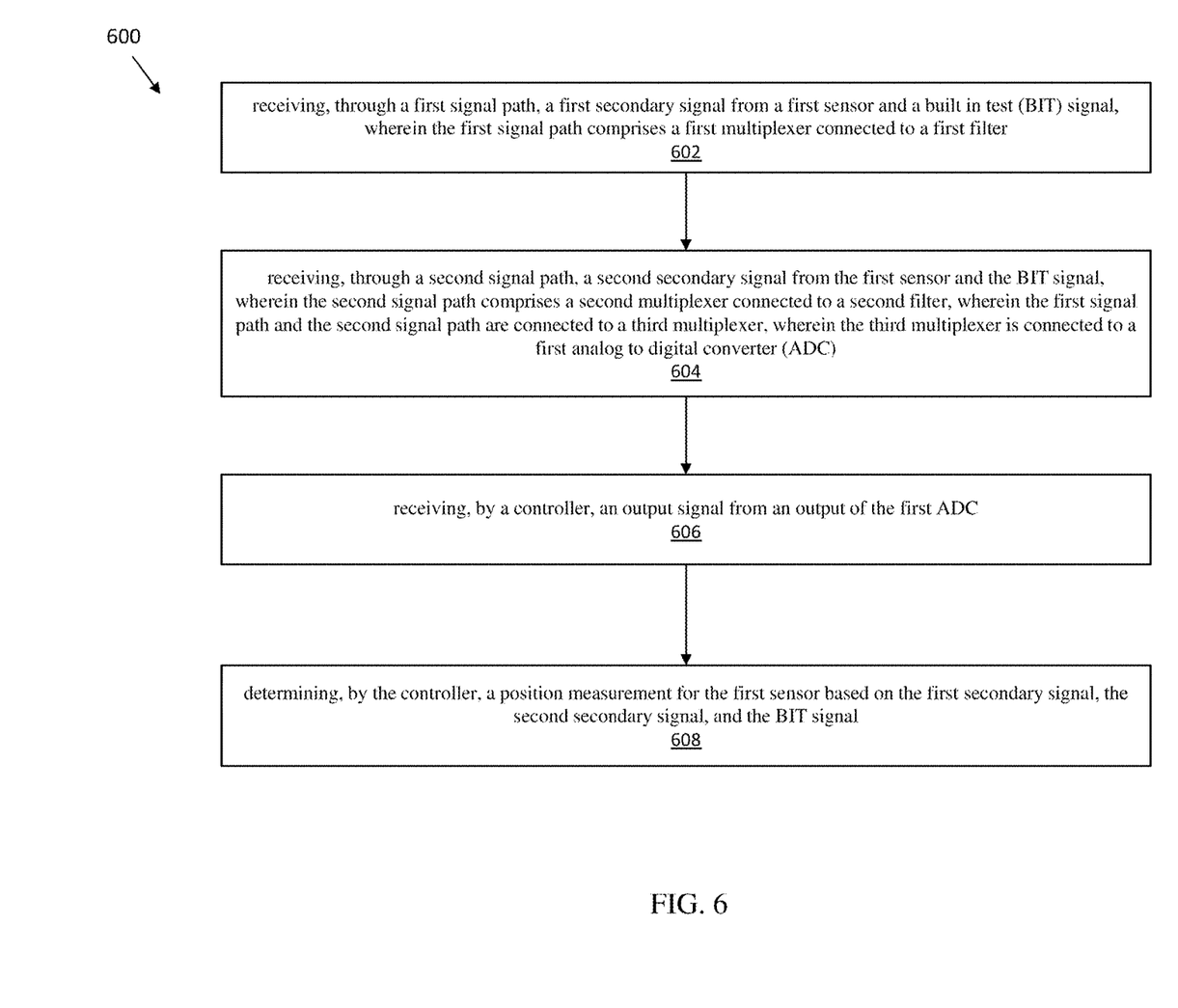
FIG. 6 depicts a flow diagram of a method for sensor position measurements according to one or more embodiments.

FIG. 6 depicts a flow diagram of a method for sensor position measurements according to one or more embodiments. The method 600 includes receiving, through a first signal path, a first secondary signal from a first sensor and a built in test (BIT) signal, wherein the first signal path comprises a first multiplexer connected to a first filter, as shown at block 602. At block 604, the method 600 includes receiving, through a second signal path, a second secondary signal from the first sensor and the BIT signal, wherein the second signal path comprises a second multiplexer connected to a second filter, wherein the first signal path and the second signal path are connected to a third multiplexer, wherein the third multiplexer is connected to a first analog to digital converter (ADC). Also, at block 606, the method 600 includes receiving, by a controller, an output signal from an output of the first ADC. And at block 608, the method 600 includes determining, by the controller, a position measurement for the first sensor based on the first secondary signal, the second secondary signal, and the BIT signals.

Additional processes may also be included. It should be understood that the processes depicted in FIG. 6 represent illustrations, and that other processes may be added or existing processes may be removed, modified, or rearranged without departing from the scope and spirit of the present disclosure.

Figure 7:
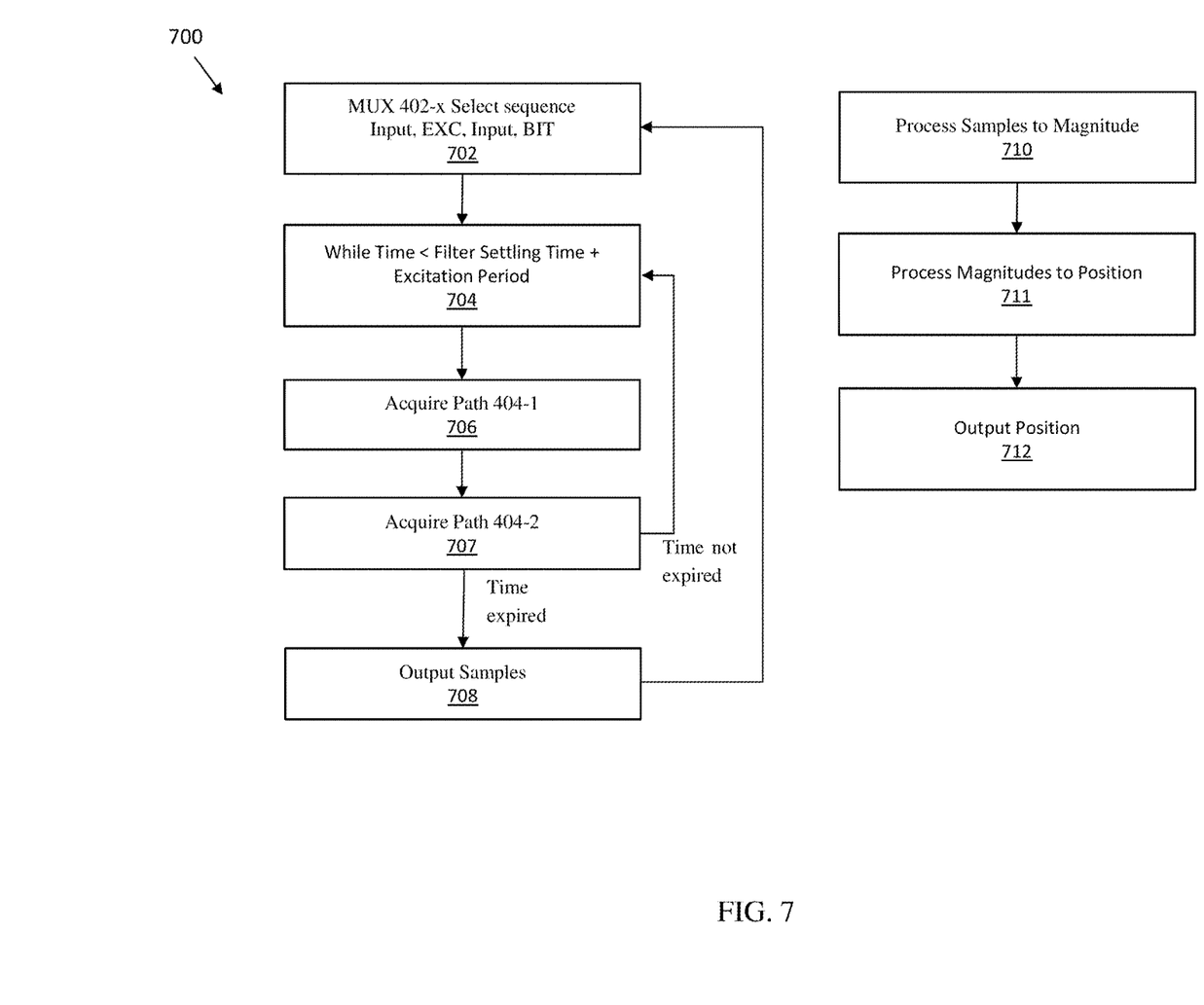
FIG. 7 depicts a flow diagram of a method for sensor position measurements according to one or more embodiments.

FIG. 7 depicts a flow diagram of a method for sensor position measurements according to one or more embodiments. Each input to the multiplexers 402-1 and 402-2 (from FIG. 5) are to be acquired and processed without interruption to avoid disrupting the filters. As shown in block 702, the sequence Input, Excitation, Input, BIT allows the Input to be updated at twice the rate of the Excitation and BIT values, since the excitation and BIT values are not expected to change, except for failures and temperature variations. After each input is selected, for a period of the Filter settling time plus once cycle of the excitation, the Multiplexer 406-1 alternatively selects the signal through Filter 404-1 as shown in block 706, then the signal through Filter 404-2 as shown in block 707, which are each acquired by the ADV 408-1. The sampling rate is typically an integer multiple of the excitation frequency to reduce jitter due to aliasing of the excitation and sampling frequencies. Once the samples have been acquired over the entire period for block 704, the next input into multiplexers 402-1 and 402-2 are selected. All of the samples acquired are passed to the Processing elements from block 708. The Processing element, either a processor or FPGA, calculates the two magnitudes from the sample sets, one from the 404-1 path and one from the 404-2 path as shown in block 710. If the sample sets represent the inputs, the magnitudes are used to calculate the sensor position as shown in block 711 and outputted as shown in block 712.

Additional processes may also be included. It should be understood that the processes depicted in FIG. 7 represent illustrations, and that other processes may be added or existing processes may be removed, modified, or rearranged without departing from the scope and spirit of the present disclosure.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system comprising:
 a signal conditioning circuit comprising:
  a first signal path comprising a first multiplexer connected to a first filter, wherein the first signal path receives a first secondary signal from a first sensor and a built in test (BIT) signal;
  a second signal path comprising a second multiplexer connected to a second filter, wherein the second signal path receives a second secondary signal from the first sensor and the BIT signal;
  wherein the first signal path and the second signal path are connected to a third multiplexer; and
  a first analog to digital converter (ADC) connected to an output of the third multiplexer; and
  a controller connected to an output of the first ADC, wherein the controller is configured to: determine a position measurement for the first sensor based on the first secondary signal, the second secondary signal, and the BIT signal;
 wherein determining the position measurement for the first sensor based on the first secondary signal, the second secondary signal, and the built in test signal comprises calculating the position, whereby:

$$\text{Position} = (E1/\text{BIT}_{1\_E1} - E2/\text{BIT}_{1\_E2})/(E1/\text{BIT}_{1\_E1} + E2/\text{BIT}_{1\_E2}),$$

wherein E1 comprises the first secondary signal, wherein E2 comprises the second secondary signal, wherein BIT1_E1 comprises the built in test signal traversing the first signal path, and wherein BIT1_E2 comprises the built in test signal traversing the second signal path.

2. The system of claim 1, wherein the signal conditioning circuit further comprises:
 a third signal path comprising a fourth multiplexer connected to a third filter, wherein the third signal path receives a third secondary signal from a second sensor and the BIT signal;

a fourth signal path comprising a fifth multiplexer connected to a fourth filter, wherein the fourth signal path receives a fourth secondary signal from the second sensor and the BIT signal;
wherein the third signal path and the fourth signal path are connected to a sixth multiplexer;
a second ADC connected to an output of the sixth multiplexer;
wherein the controller is connected to an output of the second ADC and wherein the controller is further configured to determine a position measurement of the second sensor based on the third secondary signal, the fourth secondary signal, and the BIT signal.

3. The system of claim 1, wherein the first sensor comprises a linear variable differential transformer.

4. The system of claim 1, wherein the first sensor comprises a resolver.

5. The system of claim 1, wherein the first filter comprises a 2-pole filter.

6. The system of claim 1, wherein the controller comprises a field programmable gate array (FPGA).

7. A system comprising:
a signal conditioning circuit comprising:
a first signal path comprising a first multiplexer connected to a first filter, wherein the first signal path receives a first secondary signal from a first sensor and a built in test (BIT) signal;
a second signal path comprising a second multiplexer connected to a second filter, wherein the second signal path receives a second secondary signal from the first sensor and the BIT signal;
wherein the first signal path and the second signal path are connected to a third multiplexer; and
a first analog to digital converter (ADC) connected to an output of the third multiplexer; and
a controller connected to an output of the first ADC, wherein the controller is configured to: determine a position measurement for the first sensor based on the first secondary signal, the second secondary signal, and the BIT signal;
wherein the first signal path further receives an excitation signal into an input of the first multiplexer;
wherein the BIT signal comprises a square wave having a first frequency;
wherein excitation signal comprises a second frequency; and wherein the first frequency is equivalent to the second frequency.

8. The system of claim 7, wherein the signal conditioning circuit further comprises:
a third signal path comprising a fourth multiplexer connected to a third filter, wherein the third signal path receives a third secondary signal from a second sensor and the BIT signal;
a fourth signal path comprising a fifth multiplexer connected to a fourth filter, wherein the fourth signal path receives a fourth secondary signal from the second sensor and the BIT signal;
wherein the third signal path and the fourth signal path are connected to a sixth multiplexer;
a second ADC connected to an output of the sixth multiplexer;
wherein the controller is connected to an output of the second ADC and wherein the controller is further configured to determine a position measurement of the second sensor based on the third secondary signal, the fourth secondary signal, and the BIT signal.

9. The system of claim 7, wherein the first sensor comprises a linear variable differential transformer.

10. The system of claim 7, wherein the first sensor comprises a resolver.

11. A method comprises:
receiving, through a first signal path, a first secondary signal from a first sensor and a built in test (BIT) signal, wherein the first signal path comprises a first multiplexer connected to a first filter;
receiving, through a second signal path, a second secondary signal from the first sensor and the BIT signal, wherein the second signal path comprises a second multiplexer connected to a second filter;
wherein the first signal path and the second signal path are connected to a third multiplexer;
wherein the third multiplexer is connected to a first analog to digital converter (ADC);
receiving, by a controller, an output signal from an output of the first ADC; and
determining, by the controller, a position measurement for the first sensor based on the first secondary signal, the second secondary signal, and the BIT signal;
wherein determining, by the controller, the position measurement for the first sensor based on the first secondary signal, the second secondary signal, and the built in test signal comprises calculating the position, whereby $$\text{Position} = (E1/\text{BIT}_{1\_E1} - E2/\text{BIT}_{1\_E2}) / (E1/\text{BIT}_{1\_E1} + E2/\text{BIT}_{1\_E2}),$$

wherein E1 comprises the first secondary signal, wherein E2 comprises the second secondary signal, wherein BIT1_E1 comprises the built in test signal traversing the first signal path, and wherein BIT1_E2 comprises the built in test signal traversing the second signal path.

12. The method of claim 11, further comprising:
receiving, through a third signal path, a third secondary signal from a second sensor and the BIT signal, wherein the third signal path comprises a fourth multiplexer connected to a third filter;
receiving, through a fourth signal path, a fourth secondary signal from the second sensor and the BIT signal, wherein the fourth signal path comprises a fifth multiplexer connected to a third filter;
wherein the third signal path and the fourth signal path are connected to a sixth multiplexer;
wherein the sixth multiplexer is connected to a second analog to digital converter (ADC);
receiving, by the controller, an output signal from an output of the second ADC; and
determining, by the controller, a position measurement for the second sensor based on the third secondary signal, the fourth secondary signal, and the BIT signal.

13. The method of claim 11, wherein the first sensor comprises a linear variable differential transformer.

14. The method of claim 11, wherein the first sensor comprises a resolver.

15. The method of claim 11, wherein the first filter comprises a 2-pole filter.

16. The method of claim 11, wherein the controller comprises a field programmable gate array (FPGA).

17. A method comprises:
receiving, through a first signal path, a first secondary signal from a first sensor and a built in test (BIT) signal, wherein the first signal path comprises a first multiplexer connected to a first filter;
receiving, through a second signal path, a second secondary signal from the first sensor and the BIT signal, wherein the second signal path comprises a second multiplexer connected to a second filter;

wherein the first signal path and the second signal path are connected to a third multiplexer;

wherein the third multiplexer is connected to a first analog to digital converter (ADC);

receiving, by a controller, an output signal from an output of the first ADC; and determining, by the controller, a position measurement for the first sensor based on the first secondary signal, the second secondary signal, and the BIT signal;

wherein the first signal path further receives an excitation signal into an input of the first multiplexer;

wherein the BIT signal comprises a square wave having a first frequency;

wherein excitation signal comprises a second frequency; and wherein the first frequency is equivalent to the second frequency.

18. The method of claim 17, further comprising:

receiving, through a third signal path, a third secondary signal from a second sensor and the BIT signal, wherein the third signal path comprises a fourth multiplexer connected to a third filter;

receiving, through a fourth signal path, a fourth secondary signal from the second sensor and the BIT signal, wherein the fourth signal path comprises a fifth multiplexer connected to a third filter;

wherein the third signal path and the fourth signal path are connected to a sixth multiplexer;

wherein the sixth multiplexer is connected to a second analog to digital converter (ADC);

receiving, by the controller, an output signal from an output of the second ADC; and determining, by the controller, a position measurement for the second sensor based on the third secondary signal, the fourth secondary signal, and the BIT signal.

19. The method of claim 17, wherein the first sensor comprises a linear variable differential transformer or a resolver.

20. The method of claim 17, wherein the first filter comprises a 2-pole filter and wherein the controller comprises a field programmable gate array (FPGA).

* * * * *